(12) United States Patent
Lovens

(10) Patent No.: US 6,864,419 B2
(45) Date of Patent: Mar. 8, 2005

(54) ELECTROMAGNETIC SHIELD FOR AN INDUCTION HEATING COIL

(75) Inventor: Jean Lovens, Embourg (BE)

(73) Assignee: Inductotherm Corp., Rancocas, NJ (US)

( * ) Notice: Subject to any disclaimer, the term of this patent is extended or adjusted under 35 U.S.C. 154(b) by 0 days.

(21) Appl. No.: 10/874,941

(22) Filed: Jun. 23, 2004

(65) Prior Publication Data

US 2005/0006120 A1 Jan. 13, 2005

Related U.S. Application Data

(60) Provisional application No. 60/482,825, filed on Jun. 26, 2003.

(51) Int. Cl.$^7$ .................................................. H05K 9/00
(52) U.S. Cl. .................. 174/35 CE; 219/645; 219/673; 219/671; 336/84 M
(58) Field of Search .......................... 174/35 R, 35 CE; 219/645, 672, 673, 671; 336/84 R, 84 M (56) References Cited

U.S. PATENT DOCUMENTS

| | | | | |
|---|---|---|---|---|
| 3,678,428 A | * | 7/1972 | Morris et al. | 336/84 R |
| 3,761,599 A | * | 9/1973 | Beatty | 174/15.2 |
| 3,808,489 A | * | 4/1974 | Albright et al. | 310/52 |
| 5,495,094 A | * | 2/1996 | Rowan et al. | 219/645 |
| 5,837,976 A | * | 11/1998 | Loveless et al. | 219/645 |

* cited by examiner

*Primary Examiner*—Hung V. Ngo
(74) *Attorney, Agent, or Firm*—Philip O. Post (57) ABSTRACT

An apparatus and process are provided for reducing the electromagnetic field intensity in selected regions for a field produced when ac current flows through one or more induction coils through which a workpiece moves for induction heating of the workpiece. The electromagnetic shield has transverse screen elements through which the workpiece moves at opposing ends of the one or more induction coils. One or two longitudinal screen elements connect the transverse screen elements.

14 Claims, 6 Drawing Sheets

ELECTROMAGNETIC SHIELD FOR AN INDUCTION HEATING COIL

CROSS REFERENCE TO RELATED APPLICATIONS

This application claims the benefit of U.S. Provisional Application No. 60/482,825 filed Jun. 26, 2003, hereby incorporated herein by reference in its entirety.

FIELD OF THE INVENTION

The present invention relates to electromagnetic shields or screens used with induction heating coils that inductively heat a workpiece moving through the induction coils.

BACKGROUND OF THE INVENTION

Figure 1:
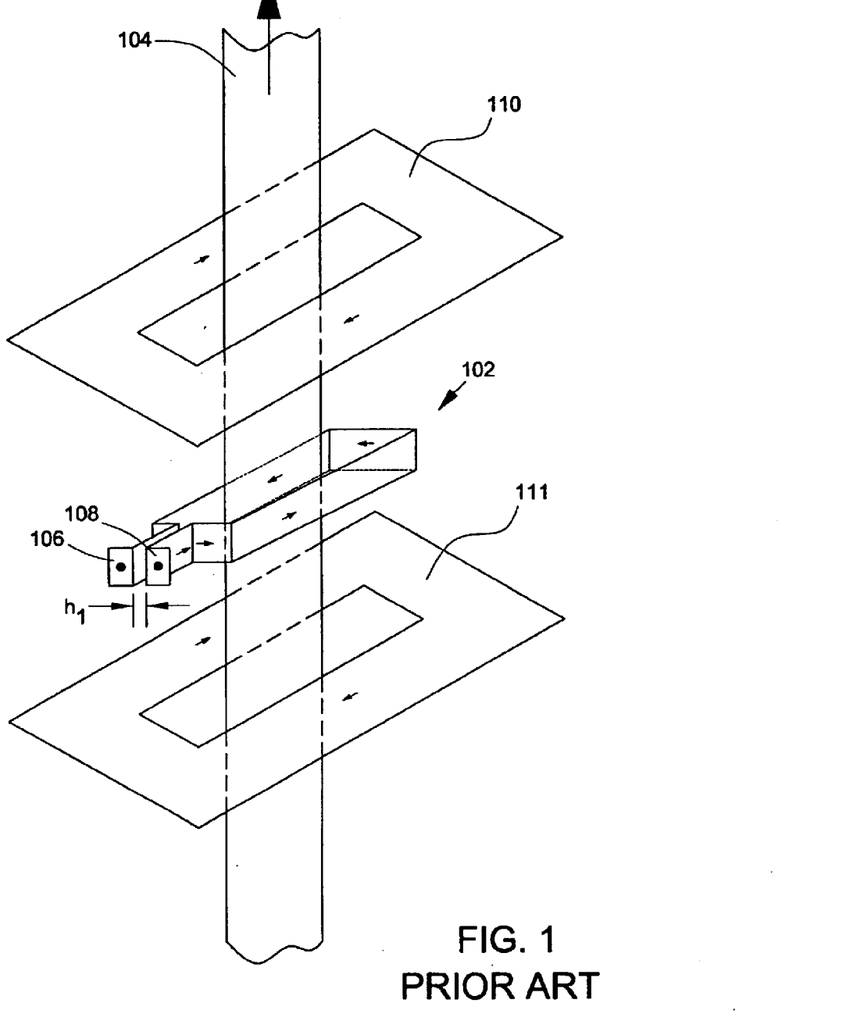
FIG. 1 is a diagrammatic view of a prior art induction coil used to inductively heat a workpiece continuously moving through it and electromagnetic screens used to reduce field intensities produced by ac current flow in the coil in regions beyond the region in which the coil and strip are magnetically coupled.

FIG. 1 illustrates a single turn induction coil 102 surrounding a metal strip 104 that continuously moves through the coil in the direction indicated by the arrow. Terminals 106 and 108 of coil 102 are connected to a suitable ac power source with instantaneous current flow through the coil as indicated by the arrows. The current flowing through the coil establishes a magnetic field that inductively heats the strip as it passes through the coil. However unless some type of electromagnetic shielding is used, the generated magnetic field intensities in regions beyond the region in which the coil and strip are magnetically coupled may exceed permissible levels.

Figure 2:
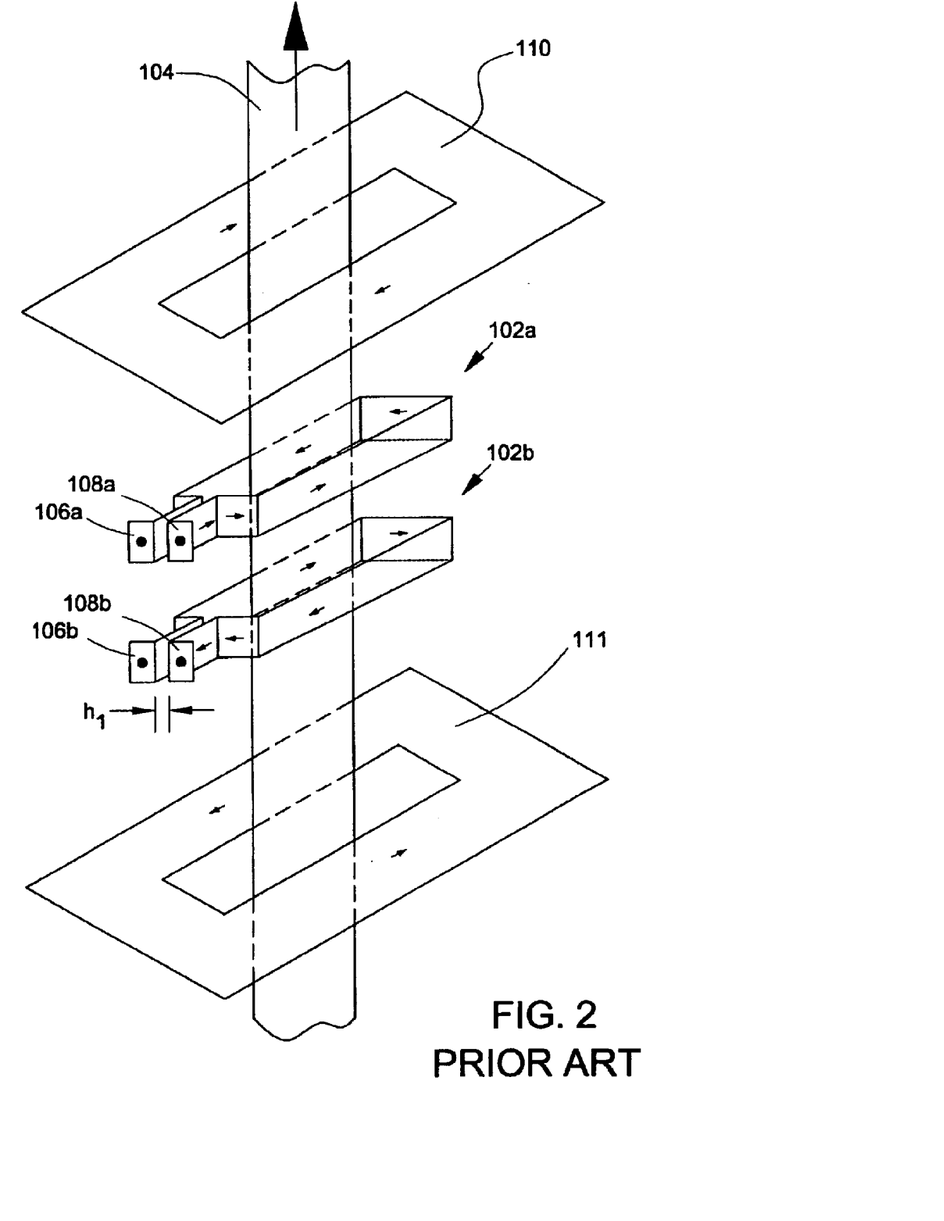
FIG. 2 is a diagrammatic view of a prior art arrangement of two induction coils with opposing instantaneous ac current flow used to inductively heat a workpiece continuously moving through it and electromagnetic screens used to reduce field intensities produced by current flow in the coil in regions beyond the region in which the coil and strip are magnetically coupled.

One known method of reducing field intensities in the desired regions is to place electrically conductive screens 110 and 111, such as a rectangular copper form, around the strip as shown in FIG. 1. As understood from Faraday's law, instantaneous current flow induced by the magnetic field in each screen will be opposite in direction to the instantaneous current flow in the induction coil. In the arrangement in FIG. 1, current will flow in the same direction in the upstream (element 111) and downstream (element 110) screens. In FIG. 2, two single turn coils 102a and 102b are used with instantaneous current flow in opposite directions established by connecting terminals 106a and 108a, and terminals 106b and 108b, to one or more suitable ac power supplies. With the arrangement of FIG. 2, current flow will be in opposite directions in the upstream and downstream screens. One disadvantage of the arrangements in FIG. 1 and FIG. 2 is that each screen is closed around the strip, which makes lateral movement of the strip in and out of the screens impossible. Such lateral movement is desirable for changing induction coils without cutting a continuous workpiece.

U.S. Pat. No. 5,034,586 discloses a method of using decoupling rings (elements 20 and 22) with a switch (element 24) in the rings. The switch opens to allow a workpiece to be moved laterally out of, or into, the decoupling rings. The decoupling rings reduce inter-coil magnetic coupling between adjacent induction coils. One disadvantage of this method is that an electrically conductive component, namely the decoupling rings, must include a mechanical switch that reduces reliability and increases operational complexity and maintenance.

Therefore there is the need for a means of electromagnetic shielding of an induction coil, through which a moving workpiece passes to be inductively heated, that would allow the workpiece to laterally move in and out of the electromagnetic shielding without the use of mechanical switches.

BRIEF SUMMARY OF THE INVENTION

In one aspect, the present invention is an apparatus for, and method of, electromagnetically shielding the magnetic field produced around one or more induction coils through which a workpiece continuously moves. The electromagnetic shield comprises first and second transverse screen elements between which the one or more induction coils are disposed. In one example of the invention the first and second transverse screen elements are connected together by a single longitudinal screen element longitudinally aligned along one side of the workpiece so that a continuous single current path is provided through the two transverse screen elements and the longitudinal screen element. In another example of the invention the first and second transverse screen elements are connected together by two longitudinal screen elements, longitudinally aligned on opposing sides of the workpiece to provide opposing current paths in the screen halves formed between the workpiece. In another example of the invention one of the screen halves is hinged to allow further longitudinal opening between the screen halves. In another example of the invention, the one or two longitudinal screen elements are extended around the perimeter of the first and second transverse screen elements to form, respectively one substantially closed conducting box, or a substantially closed conducting box formed from two half-sections, around the one or more induction coils, while allowing the workpiece to laterally move in and out of the electromagnetic shielding formed by the box structure in place without the use of mechanical switches.

Other aspects of the invention are set forth in this specification.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

DETAILED DESCRIPTION OF THE INVENTION

Figure 3:
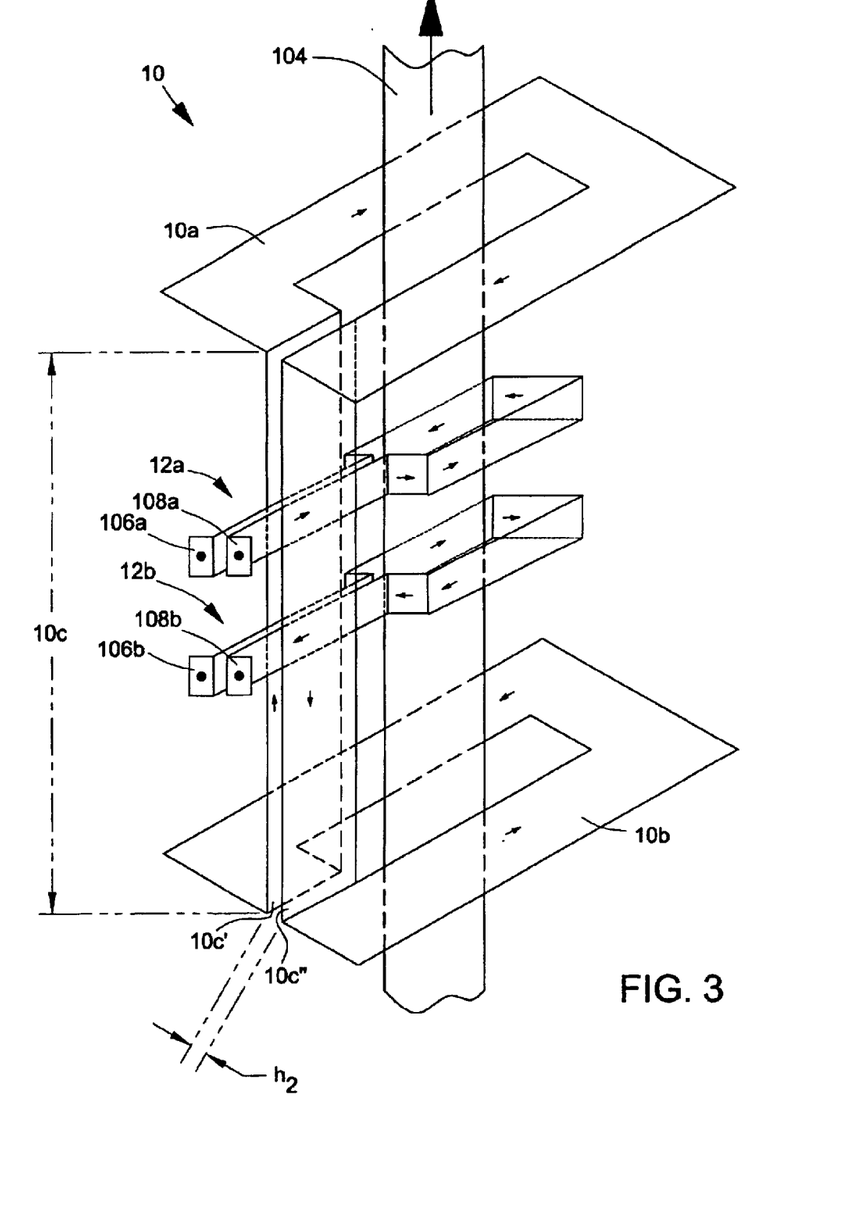
FIG. 3 is a diagrammatic view of one example of the electromagnetic screen of the present invention.

Referring now to the drawings, wherein like numerals indicate like elements, there is shown in the FIG. 3, one example of the electromagnetic shield or screen 10 of the present invention that forms an electromagnetic shield. The screen comprises first transverse screen element 10a, second transverse screen element 10b, and longitudinal screen element 10c, which connects the first and second transverse elements together as shown in FIG. 3. Longitudinal screen element 10c consists of first and second longitudinal screen sections 10c' and 10c" that are substantially parallel to each other and separated by gap $h_1$. In this non-limiting example of the invention, two single turn coils 12a and 12b are suitably connected to one or more ac power sources so that instantaneous ac current flows in opposing directions in the two coils as indicated by the arrows. The coils are disposed between the first and second transverse screen elements of screen 10. A continuous workpiece 104, such as a metal strip, moves through the induction coils and screen, and is inductively heated by current flow in the coils. In general, but not by way of limitation, the planes of the first and second transverse screen elements are substantially perpendicular to the direction in which the workpiece moves. All drawings of the present invention are diagrammatic; positioning of the screen elements relative to the workpiece can be adjusted to suit a particular application. In this non-limiting arrangement ac current flow in screen 10 is as indicated by the arrows. The gap between the first and second longitudinal screen sections of longitudinal screen element 10c, namely $h_2$, provides a means for lateral movement of the strip from in and out of the shield. The opening $h_2$ is sufficiently small so that opposing electromagnetic fields established by opposing instantaneous currents in the two longitudinal screen sections that comprise longitudinal screen element 10c substantially cancel each other out. If gap $h_2$ is too small to allow lateral movement of the strip in and out of the screen, then screen 10 must include flexing means for moving the two longitudinal screen sections apart so that the workpiece can be moved laterally away from shield. For example the section of the first and second transverse screen elements located adjacent to the edge of the workpiece opposite the edge of the workpiece adjacent to gap $h_2$ may be formed from a material that allows non-deforming flexing apart of the two longitudinal screen sections to increase the size of gap $h_2$.

Gap $h_2$ establishes a discontinuity in the first and second transverse screen elements. First longitudinal screen section 10c' is connected between the first end of gap $h_2$ in the first transverse screen element and the first end of gap $h_2$ in the second transverse screen element; second longitudinal screen section 10c" is connected between the second end of gap $h_2$ in the first transverse screen element and the second end of gap $h_2$ in the second transverse screen element. In this arrangement a closed screen circuit path is established by the first transverse screen element, the first longitudinal screen section, the second transverse screen element, and the second longitudinal screen section. As previously stated the first and second longitudinal screen sections 10c' and 10c" that make up the longitudinal screen element 10c are disposed relative to each other so that opposing electromagnetic fields established by opposing instantaneous currents in the first and second longitudinal screen sections substantially cancel each other out.

Figure 5:
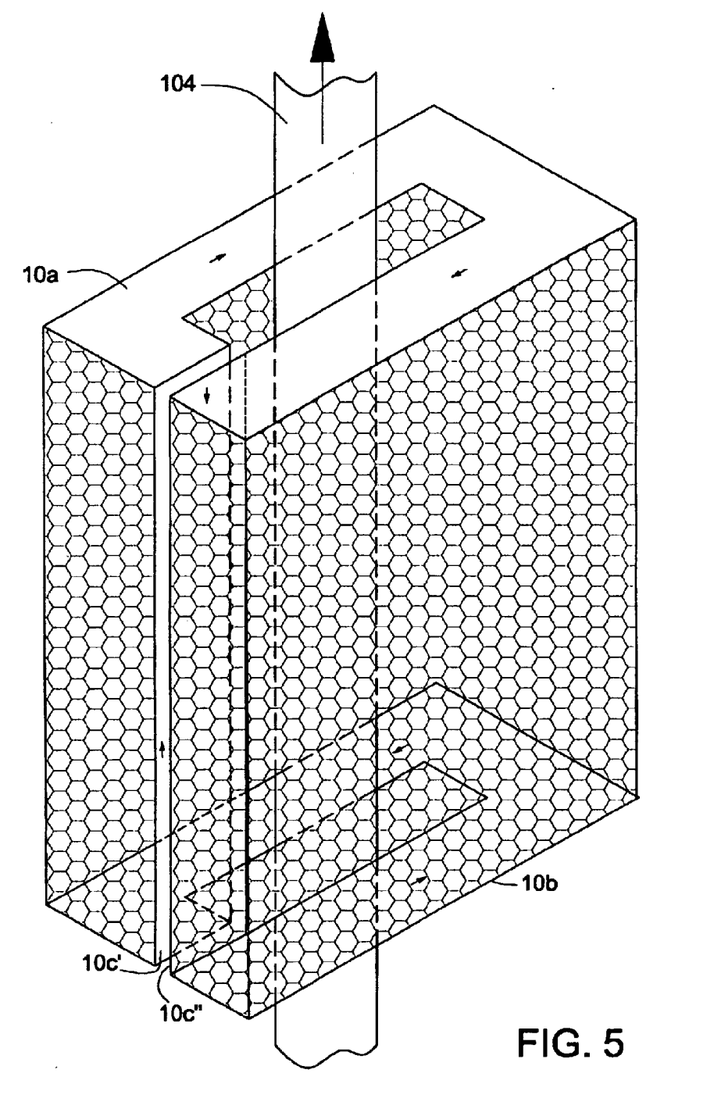
FIG. 5 is a diagrammatic view of another example of the electromagnetic screen of the present invention wherein the longitudinal screen element shown in FIG. 3 is extended around the induction coils to form a box-shaped electromagnetic screen.

In other examples of the invention the first and second longitudinal screen sections that comprise longitudinal screen element 10c can be extended around induction coils 12a and 12b to form a substantially closed conducting box around the coils. For example as shown in FIG. 5, wherein coils 12a and 12b are not shown for clarity, the first and second longitudinal screen sections 10c' and 10c" are extended (partially shown as cross hatched regions in FIG. 5) around the outer perimeters of first and second transverse elements 10a and 10b to form a substantially closed box-shaped electromagnetic shield around the coils and the workpiece. The box is open along gap $h_2$, and sufficiently open at each end at least to allow the workpiece to pass through.

Figure 4:
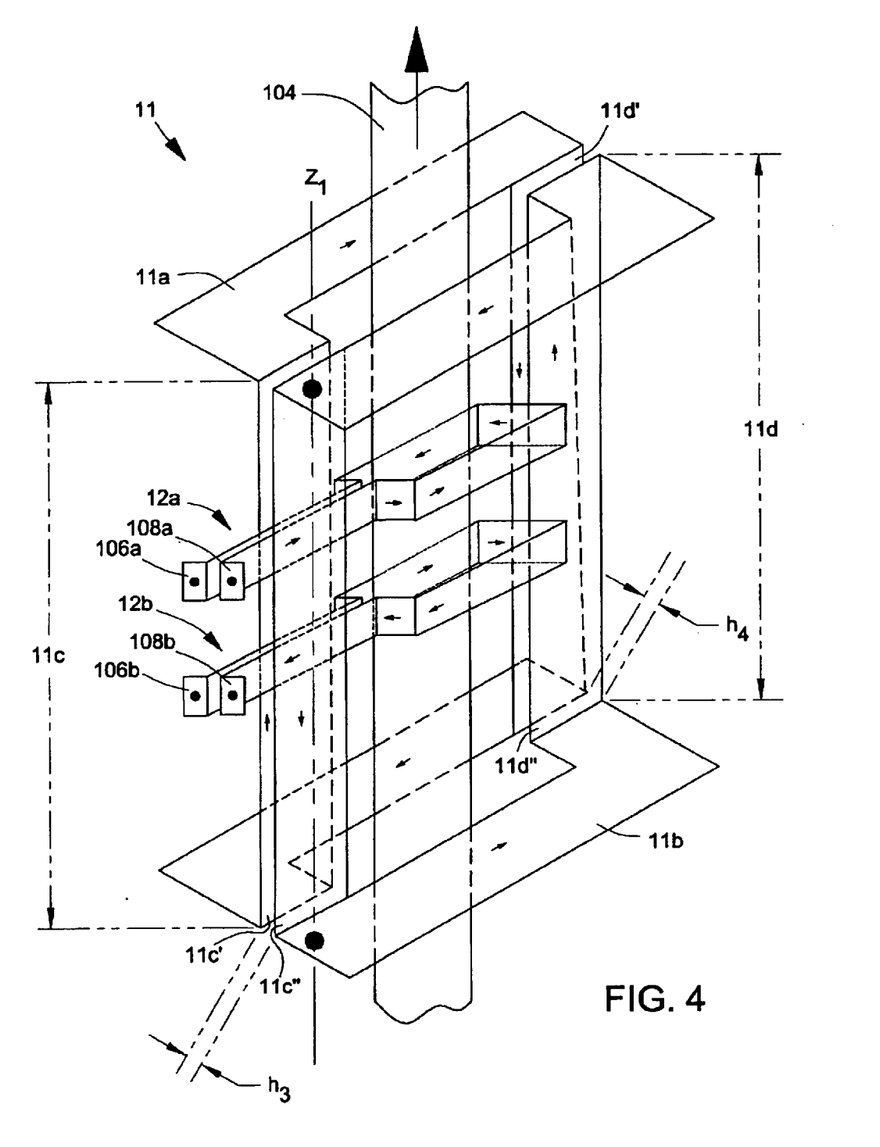
FIG. 4 is a diagrammatic view of another example of the electromagnetic screen of the present invention.

FIG. 4 illustrates another example of the present invention. In this arrangement first and second transverse screen elements 11a and 11b, respectively, are connected together by first and second longitudinal screen elements 11c and 11d to form shield or screen 11. Longitudinal screen element 11c consists of first and second longitudinal screen sections 11c' and 11c", respectively, that are substantially parallel to each other and separated by gap $h_3$. Longitudinal screen element 11d consists of first and second longitudinal screen sections 11d' and 11d", respectively, that are substantially parallel to each other and separated by gap $h_4$. Generally, but not by way of limitation, gaps $h_3$ and $h_4$ are equal to each other. In this arrangement an integral half screen is formed on either side of the workpiece. In this non-limiting example of the invention, two single turn coils 12a and 12b are suitably connected to one or more ac power sources so that instantaneous ac current flows in opposing directions in the two coils as indicated by the arrows. The coils are disposed between the first and second transverse screen elements of screen 11. A continuous workpiece 104, such as a metal strip, moves through the induction coils and screen, and is inductively heated by current flow in the coils. In general, but not by way of limitation, the planes of the first and second transverse screen elements are substantially perpendicular to the direction in which the workpiece moves. In this non-limiting arrangement ac current flows in each of the two half screens as indicated by the arrows. The openings $h_3$ and $h_4$ are sufficiently small so that opposing electromagnetic fields established by opposing instantaneous currents in the two longitudinal screen sections that comprise screen longitudinal elements 11c and 11d substantially cancel each other out.

For the example of the invention shown in FIG. 4 one, or both, screen halves may be retracted from around the induction coils without impacting the inductive coupling between the induction coils and the workpiece. Unlike the previous example of the invention illustrated in FIG. 3, if the gaps between longitudinal screen sections comprising longitudinal screen elements 11c and 11d are not large enough to laterally remove the workpiece from within the there is no need for flexible parts in the screen to enlarge the gap to allow the lateral movement of the workpiece in and out of the screen. Alternatively, hinge means can be provided to rotate one or both of the screen halves about a longitudinal axis, such as longitudinal axis $Z_1$ in FIG. 4.

In the example of the invention in FIG. 4, gap $h_3$ establishes a first discontinuity in the first and second transverse screen elements, and gap $h_4$ establishes a second discontinuity in the first and second transverse screen elements. First longitudinal screen section 11c' is connected between the first end of gap $h_3$ in the first transverse screen element and the first end of gap $h_3$ in the second transverse screen element; second longitudinal screen section 11c" is connected between the second end of gap $h_3$ in the first transverse screen element and the second end of gap $h_3$ in the second transverse screen element. Third longitudinal screen section 11d' is connected between the first end of gap $h_4$ in the first transverse screen element and the first end of gap $h_4$ in the second transverse screen element; fourth longitudinal screen section 11d" is connected between the second end of gap $h_4$ in the first transverse screen element and the second end of gap $h_4$ in the second transverse screen element. In this arrangement a first closed screen circuit path is established by the first half of the first transverse screen element, the first longitudinal screen section, the first half of the second transverse screen element, and the third longitudinal screen section, all of which comprise the first screen half. Similarly a second closed screen circuit path is established by the second half of the first transverse screen element, the second longitudinal screen section, the second half of the second transverse screen element, and the fourth longitudinal screen section, all of which comprise the second screen half. As previously stated the first and second longitudinal screen sections $11c'$ and $11c''$ that make up the first longitudinal screen element $11c$, are disposed relative to each other so that opposing electromagnetic fields established by opposing instantaneous currents in the first and second longitudinal screen sections substantially cancel each other out, as are the third and fourth longitudinal screen sections $11d'$ and $11d''$ that make up the second longitudinal screen element $11d$.

Figure 6:
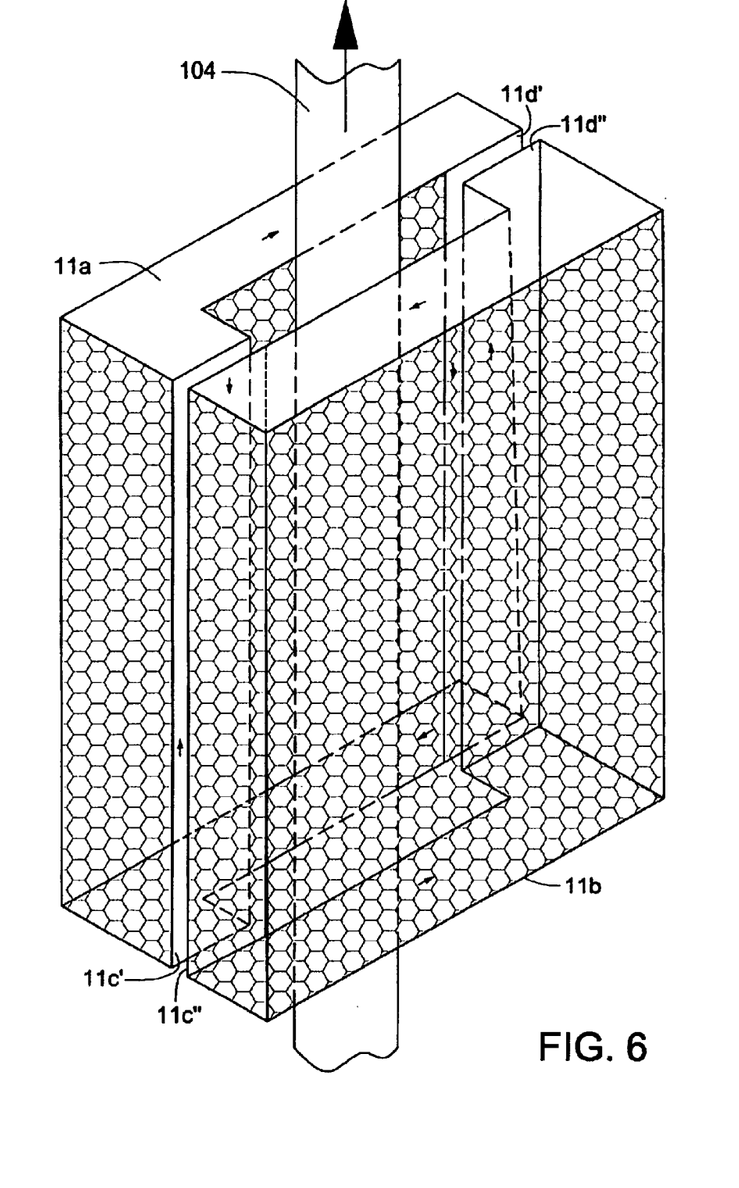
FIG. 6 is a diagrammatic view of another example of the electromagnetic screen of the present invention wherein the longitudinal screen elements shown in FIG. 4 are extended around the induction coils to form a box-shaped electromagnetic screen.

In other examples of the invention the first and second longitudinal screen sections that comprise longitudinal screen elements $11c$ and $11d$ can be extended around induction coils $12a$ and $12b$ to form a substantially closed conducting box around the coils. For example as shown in FIG. 6 wherein coils $12a$ and $12b$ are not shown for clarity, the first and third longitudinal screen sections $11c'$ and $11d'$, respectively, are extended around the outer perimeters of the first halves of the first and second transverse elements $11a$ and $11b$, and the second and fourth longitudinal screen sections $11c''$ and $11d''$, respectively, are extended around the outer perimeters of the second halves of the first and second transverse elements $11a$ and $11b$ to form a substantially closed box-shaped electromagnetic shield around the coils and the workpiece. The box is open along gaps $h_3$ and $h_4$, and sufficiently open at each end at least to allow the workpiece to pass through.

The term "screen" is used in all examples of the invention to describe a substantially electrically conductive material in any form such as, but not limited to, a solid or mesh material formed from copper or an aluminum based alloy.

Two individual single turn coils are used in the examples of the invention only to illustrate and not limit the scope of the invention. Generally the arrangement of induction coils, both quantities and types of coils, between the two transverse screen elements, and directions of instantaneous current in the induction coils can be any arrangement that results in the screen currents as disclosed in the above examples of the invention. Further the coil arrangements disclosed in U.S. Pat. No. 5,495,094 and No. 5,837,976 may be used in the examples of the invention, and both of these patents are incorporated herein by reference in their entirety.

The foregoing examples do not limit the scope of the disclosed invention. The scope of the disclosed invention is further set forth in the appended claims.

What is claimed is:

1. An electromagnetic shield for shielding a magnetic field produced around a one or more coils having ac current flowing in the one or more coils, through which a workpiece moves for induction heating of the workpiece by the magnetic field, the electromagnetic shield comprising:

a first transverse screen element and a second transverse screen element through which the workpiece moves, the first and second transverse screen elements disposed at opposing ends of the one or more coils, each of the first and second transverse screen elements having a discontinuity, a first longitudinal screen section connecting a first end of the first transverse screen element at the discontinuity in the first transverse screen element to a first end of the second transverse screen element at the discontinuity in the second transverse screen element, the first longitudinal screen section disposed laterally to an edge of the workpiece; and a second longitudinal screen section connecting a second end of the first transverse screen element at the discontinuity in the first transverse screen element to a second end of the second transverse screen element at the discontinuity in the second transverse screen element, the second longitudinal screen section disposed laterally to the edge of the workpiece and adjacent to the first longitudinal screen section, whereby current induced in the electromagnetic shield by the, magnetic field flows in the closed circuit path established by the first transverse screen element, the first longitudinal screen section, the second transverse screen element and the second longitudinal screen section, and opposing electromagnetic fields established by opposing currents in the first and second longitudinal screen sections substantially cancel each other.

2. The electromagnetic shield of claim 1 wherein the first and second longitudinal screen sections extend around the perimeters of the first transverse screen element and second transverse screen element to form a substantially closed box-shaped electromagnetic screen around the one or more coils.

3. The electromagnetic shield of claim 1 wherein the sides of the first and second transverse screen elements adjacent to the edge of the workpiece opposite the edge of the workpiece adjacent to the first and second longitudinal screen sections are formed from a flexible material to allow bending the electromagnetic shield along the length of the workpiece to permit further opening of the discontinuity between the first and second longitudinal screen sections for removal of the workpiece.

4. The electromagnetic shield of claim 2 wherein the sides of the first and second transverse screen elements adjacent to the edge of the workpiece opposite the edge of the workpiece adjacent to the first and second longitudinal screen sections are formed from a flexible material to allow bending the electromagnetic shield along the length of the workpiece to permit further opening of the discontinuity between the first and second longitudinal screen sections for removal of the workpiece.

5. A method of shielding a magnetic field produced around a one or more coils having an ac current flowing in the one or more coils through which a workpiece moves for induction heating of the workpiece by the magnetic field, the method comprising:

forming a first transverse screen element through which the workpiece moves at a first end of the one or more coils, the first transverse screen element having a discontinuity located adjacent to an edge of the workpiece;

forming a second transverse screen element through which the workpiece moves at the end of the one or more coils opposite the first end, the second transverse screen element having a discontinuity located adjacent to the edge of the workpiece;

connecting a first longitudinal screen section between a first end of the fist transverse screen element at the discontinuity in the first transverse screen element to a first end of the second transverse screen element at the discontinuity in the second transverse screen element, the first longitudinal screen section disposed laterally to an edge of the workpiece; and connecting a second longitudinal screen section between a second end of the second transverse screen element at the discontinuity in the first transverse screen element to a second end of the second transverse screen element at the discontinuity in the second transverse screen element, the second longitudinal screen section disposed laterally to the edge of the workpiece and adjacent to the first longitudinal screen element.

6. The method of claim 5 further comprising the step of extending the first and second longitudinal screen sections around the perimeters of the first and second transverse screen elements to form a substantially box-shaped electromagnetic shield around the one or more coils.

7. The method of claim 5 further comprising the step of forming the sides of the first and second transverse screen elements adjacent to the edge of the workpiece opposite the edge of the workpiece adjacent to the first and second longitudinal screen section from a flexible material.

8. The method of claim 6 further comprising the step of forming the sides of the first and second transverse screen elements adjacent to the edge of the workpiece opposite the edge of the workpiece adjacent to the first and second longitudinal screen section from a flexible material.

9. An electromagnetic shield for shielding a magnetic field produced around a one or more coils having ac current flowing through the one or more coils, through which a workpiece moves for induction heating of the workpiece by the magnetic field, the electromagnetic shield comprising:

a first transverse screen element through which the workpiece moves, the first transverse screen element disposed at a first end of the one or more coils, the first transverse screen element having a first discontinuity and a second discontinuity, the first and second discontinuities of the first transverse screen element disposed on opposing sides of the workpiece, the first and second discontinuities in the first transverse screen element separating the first transverse screen element into a first and second partial first transverse screen elements;

a second transverse screen element through which the workpiece moves, the second transverse screen element disposed at the end of the one or more coils opposing the first end, the second transverse screen element having a first discontinuity and a second discontinuity, the first and second discontinuities of the second transverse screen element disposed on opposing sides of the workpiece, the first and second discontinuities in the second transverse screen element separating the second transverse screen element into a first and second partial second transverse screen elements;

a first longitudinal screen element connecting a first end of the first transverse screen element at the first discontinuity in the first transverse screen element to a first end of the second transverse screen element at the first discontinuity in the second transverse screen element, the first longitudinal screen element disposed laterally to the workpiece;

a second longitudinal screen element connecting a second end of the first transverse screen element at the first discontinuity in the first transverse screen element to a second end of the second transverse screen element at the first discontinuity in the second screen element, the second longitudinal screen element disposed laterally to the workpiece and adjacent to the first longitudinal screen element;

a third longitudinal screen element connecting a first end of the first transverse screen element at the second discontinuity in the first transverse screen element to a first end of the second transverse screen element at the second discontinuity in the second screen element, the third longitudinal screen element disposed laterally to the workpiece; and a fourth longitudinal screen element connecting a second end of the first transverse screen element at the second discontinuity in the first transverse screen element to a second end of the second transverse screen element at the second discontinuity in the second transverse screen element, the fourth longitudinal screen element disposed laterally to the workpiece and adjacent to the first longitudinal screen element, whereby instantaneous ac current induced in the electromagnetic shield by the magnetic field flows in opposing directions in a first closed circuit path and a second closed circuit path, the first closed circuit path established by a first half screen element comprising the first partial first transverse screen element, the first longitudinal screen section, the first partial second transverse screen element and the third longitudinal screen the second closed circuit path established by a second half screen element comprising the second partial first transverse screen element, the second longitudinal screen section, the second partial second transverse screen element and the fourth longitudinal screen section.

10. The electromagnetic shield of claim 9 wherein the first and third longitudinal screen sections extend around the first partial first transverse screen element and first partial second transverse screen element, and the second and fourth longitudinal screen sections extend around the second partial first transverse screen element and second partial second transverse screen element to form a substantially closed box-shaped electromagnetic screen around the one or more coils.

11. The electromagnetic shield of claim 9 further comprising a means for hinging the first partial first and second transverse screen elements, or the second partial first and second transverse screen elements, along the length of the workpiece to permit pivoting the first or second half screens away from the workpiece for removal of the workpiece from between the first and second half screens.

12. The electromagnetic shield of claim 10 further comprising a means for hinging the first partial first and second transverse screen elements, or the second partial first and second transverse screen elements, along the length of the workpiece to permit pivoting the first or second half screens away from the workpiece for removal of the workpiece from between the first and second half screens.

13. A method of shielding a magnetic field produced around a one or more coils having an ac current flowing through the one or more coils through which a workpiece moves for induction heating of the workpiece by the magnetic field, the method comprising:

forming a first transverse screen element through with the workpiece moves at a first end of the one or more coils, the first transverse screen element having a first discontinuity and a second discontinuity, the first and second discontinuities disposed at the opposing edges of the workpiece located along a lateral edge of the workpiece, the first and second discontinuities in the first transverse screen element separating the first transverse screen element into a first and second partial first transverse screen elements;

forming a second transverse screen element through which the workpiece moves at the end of the one or more coils opposing the first end, the second transverse screen element disposed substantially transverse to the direction in which the workpiece moves, the first and second discontinuities disposed at the opposing edges of the workpiece located along a lateral edge of the workpiece, the first and second discontinuities in the second transverse screen element separating the second transverse screen element into a first and second partial second transverse screen elements;

connecting a first longitudinal screen element between a first end of the first transverse screen element at the first discontinuity in the first screen element to a first end of the second transverse screen element at the first discontinuity in the second screen, the first longitudinal screen element disposed laterally to an edge of the workpiece; and connecting a second longitudinal screen element between a second end of the first transverse screen element at the first discontinuity in the first screen element to a second end of the second transverse screen element at the first discontinuity in the second transverse screen, the second longitudinal screen element disposed laterally to the edge of the workpiece and adjacent to the first longitudinal screen element;

connecting a third longitudinal screen element between a first end of the first transverse screen element at the second discontinuity in the first screen element to a first end of the second transverse screen element at the second discontinuity in the second screen, the third longitudinal screen element disposed laterally to an edge of the workpiece; and connecting a fourth longitudinal screen element between a second end of the first transverse screen element at the second discontinuity in the first screen element to a second end of the second transverse screen element at the second discontinuity in the second transverse screen, the fourth longitudinal screen element disposed laterally to the edge of the workpiece and adjacent to the third longitudinal screen element.

14. The method of claim 13 further comprising the step of extending the first and third longitudinal screen sections around the perimeters of the first partial first and second transverse screen elements, and the second and fourth longitudinal screen sections around the perimeters of the second partial first and second transverse screen elements to form a substantially box-shaped electromagnetic shield around the one or more coils.

* * * * *